US007045821B2

(12) United States Patent
Shih et al.

(10) Patent No.: US 7,045,821 B2
(45) Date of Patent: May 16, 2006

(54) PIXEL STRUCTURE OF DISPLAY AND DRIVING METHOD THEREOF

(75) Inventors: Po-Sheng Shih, Taoyuan (TW); Kei-Hsiung Yang, Taoyuan (TW)

(73) Assignee: Hannstar Display Corporation, Taoyuan (TW)

( * ) Notice: Subject to any disclaimer, the term of this patent is extended or adjusted under 35 U.S.C. 154(b) by 45 days.

(21) Appl. No.: 10/708,849

(22) Filed: Mar. 29, 2004

(65) Prior Publication Data

US 2005/0105031 A1 May 19, 2005

(51) Int. Cl.

| | |
|---|---|
| ***H01L 27/15*** | (2006.01) |
| ***H01L 31/12*** | (2006.01) |
| ***H01L 33/00*** | (2006.01) |

(52) U.S. Cl. ............................ 257/79; 257/82; 257/83; 257/84; 257/88

(58) Field of Classification Search .................. 257/13, 257/59, 72, 79, 82–84, 88; 345/76, 82, 92
See application file for complete search history.

(56) References Cited

U.S. PATENT DOCUMENTS 6,781,567 B1 * 8/2004 Kimura ....................... 345/92

FOREIGN PATENT DOCUMENTS

JP 2005-148704 * 6/2005

* cited by examiner

*Primary Examiner*—Thien F. Tran
(74) *Attorney, Agent, or Firm*—Jianq Chyun IP Office

(57) ABSTRACT

A pixel structure of a display and a driving method thereof are disclosed. The pixel structure disclosed in the invention includes a structure with less elements than that of prior art. The driving method thereof is also much easier than that of prior art. The pixel structure and driving method thereof can completely compensate the variations of the threshold voltage of a driving transistor thereof. The pixel structure includes a switching transistor, a driving transistor, a capacitor, a light emitting diode (LED) and a reset transistor.

36 Claims, 5 Drawing Sheets

PIXEL STRUCTURE OF DISPLAY AND DRIVING METHOD THEREOF

CROSS REFERENCE TO RELATED APPLICATIONS

This application claims the priority benefit of Taiwan application serial no. 92131760, filed on Nov. 13, 2003.

BACKGROUND OF INVENTION

1. Field of the Invention

The present invention relates to a pixel structure of a display and a driving method thereof, and more particularly to a pixel structure of a display and a driving method thereof, which compensate threshold voltages of the transistors thereof.

2. Description of the Related Art

Array displays include liquid crystal displays (LCD), inorganic and organic light emitting diode (LED) displays, etc. As to LCD, backlight modules, liquid crystal and thin film transistors in pixels are used to generate images. During displaying, the backlight modules should continuously generate light for the electronic devices, such as notebooks or PDA. The operation of the displays thereof will consume substantial power. Contrary, organic LED displays uses pixels on demand for displaying and consuming less power.

Moreover, organic LED displays also have the other advantages, such as high luminance, low power consumption, wide viewing angles, low costs, and low weight. Therefore, organic LED displays gradually have been applied to different display applications. Referring to FIG. 1, a pixel structure of the active-matrix-addressed organic LED display includes two N-type thin film transistors 110 and 120. A row selecting line 110*a* is adapted to turn on the thin film transistor 110, in order to apply the voltage of the data signal line 110*b* to the capacitor 140 for driving the thin film transistor 120 as to generate light.

Although the active-matrix-addressed organic LED displays have the aforementioned advantages, the luminance thereof is not stable, caused by several reasons. One of them is that because the luminance of the organic LED is proportional to the current, the threshold voltage of the thin film transistor 120 shifts during a long-time operation as to cause the instability of the current flowing therethrough. Another reason is the process inconsistence of the thin film transistors within each pixel resulting in different threshold voltages. Accordingly, the light generated therefrom is not stable. In addition, the material of the organic LED is another reason causing the problem. The turn on voltage of the organic LED (OLED) will be shifted because of an operational temperature change.

James L. Sanford and Frank R. Libsch, of IBM inc., disclosed a pixel structure of LED display, titled "TFT AMOLED Pixel Circuits and Driving Methods," in Society For Information Display (SID). Please refer to FIGS. 2A and 2B. A pixel structure of a display is shown in FIG. 2A and the pixel structure includes three N-type transistors 210, 220 and 230. A gate terminal of the transistor 210 is electrically connected to a row selecting line 210*a*, a source terminal thereof is electrically connected to a data signal line 210*b*, i.e. a data signal line and a drain terminal thereof is electrically connected to the transistors 220 and 230, and to a light emitting diode 240 via a capacitor 250. A gate terminal of the transistor 220 is electrically connected to an autozero line (AZ). The capacitor 250 is disposed between the gate and source terminals of the transistor 230 for storing the threshold voltage and the data voltage. FIG. 2B is a timing diagram of the pixel structure of the display shown in FIG. 2A.

The driving time of the organic LED display includes three time zones. The first time zone is used to store the threshold voltage in the capacitor 250. The second time zone is used to write in data. The third time zone is used to display. The step of writing in the threshold voltage includes: maintaining the AZ signal in a high state, Vca, for storing the threshold voltage in the capacitor 250; raising the Vca to 10 V for turning on the thin film transistor 230; and lowering the Vca to 0 V for charging the capacitor 250 to the threshold voltage of the thin film transistor 230.

Then, the Vca is 0 V and the AZ signal is in a low state so that the data is written in. If the voltage drop on the light emitting diode 240 does not change, the voltage of the capacitor 250 will be Vdata+Vt, where the Vdata means the voltage for the data and the Vt means the threshold voltage. After the data is written in, the Vca is −18 V. A current flowing through the thin film transistor 230 is proportional to $(Vdata+Vt-Vt)^2$, i.e. $(Vdata)^2$.

FIG. 2C is a drawing showing luminance with the data voltage Vdata for the modified voltage follower (solid) and a standard voltage follower (dashed) circuits. The line (A) represents the pixel structure of FIG. 2A; the dash line (B) represents the conventional pixel structure of FIG. 1. Under the same operation of Vdata, the former has a better luminance than that of the later. FIG. 2D a drawing showing luminance difference with the data voltage Vdata for the modified voltage follower (solid) and a standard voltage follower (dashed) circuits, when the variations of the data voltage Vdata and the threshold voltage are under 2 V. The line (C) represents the pixel structure of FIG. 2A; the dash line (D) represents the prior art pixel structure of FIG. 1. When Vdata is higher than 2.5 V, the former has a worse luminance than that of the later by 20%. If Vdata is less than 2.5 V, it will be much worse. The reason of the issue is that the thin film transistor 230 induces the voltage of the light emitting diode 240 to 0 V during the writing of the data. In addition, different threshold voltages are applied to the capacitor 250 when Vca is introduced from Vt to −18 V. Therefore, the issue will affect the operation of the organic LED display.

SUMMARY OF INVENTION

Therefore, the present invention discloses a pixel structure of a display and a driving method thereof, which are easier than those of prior art and compensate the threshold voltage of the thin film transistors.

To achieve the object described above, the present invention discloses a pixel structure of a display, which comprises: a switching transistor, a driving transistor, a first capacitor, a light emitting diode and a reset transistor. A gate terminal of the switching transistor is electrically connected to a scan line, and a source terminal thereof is electrically connected to a signal line. A gate terminal of the driving transistor is electrically connected to a drain terminal of the switching transistor. The first capacitor is disposed between the gate terminal of the driving transistor and a source terminal thereof. The light emitting diode has a first terminal electrically connected to a operational voltage, and a second terminal electrically connected to a drain terminal of the driving transistor. A gate terminal of the reset transistor is electrically connected to an autozero, a drain terminal is electrically connected to the driving transistor, and a source terminal electrically connected to a ground voltage.

As to the pixel structure described above, the driving method thereof comprises: turning on the switching transistor at a threshold voltage writing timing, then turning off the reset transistor and applying a start voltage to the gate terminal of the driving transistor; lowering the operational voltage to a low voltage at an data writing timing for turning off the light emitting diode, applying an data voltage to the gate terminal of the driving transistor; and turning off the switching transistor after the data writing timing, raising the operational voltage to a high voltage, turning on the reset transistor for driving the light emitting diode.

As to the driving method described above, the step of turning on the switching transistor is by inputting a scan voltage via the scan line. The start voltage and the data voltage are applied to the gate terminal of the driving transistor via the signal line.

In the exemplary embodiment, the reset transistor is turned off after a delay time, when the switching transistor is turned on by the scanning voltage via the scan line; and the delay time is determined by a time of tuning on the switching transistor.

As to the driving method described above, the gate terminal of the reset transistor is electrically connected to an autozero line. The first terminal of the light emitting diode is an anode, and the second terminal thereof is a cathode.

To achieve the object described above, the present invention discloses another pixel structure of a display, which comprises: a switching transistor, a driving transistor, a first capacitor, a light emitting diode and a reset transistor. A gate terminal of the switching transistor is electrically connected to a scan line, and a source terminal thereof is electrically connected to a signal line. A gate terminal of the driving transistor is electrically connected to a drain terminal of the switching transistor. The first capacitor is disposed between the gate terminal of the driving transistor and a source terminal thereof. The light emitting diode has a second terminal electrically connected to a ground voltage, and a first terminal electrically connected to a source terminal of the driving transistor. A gate terminal of the reset transistor is electrically connected to an autozero, a source terminal is electrically connected to the driving transistor, and a drain terminal electrically connected to an operational voltage.

As to the pixel structure described above, the driving method thereof comprises: turning on the switching transistor at a threshold voltage writing timing, then raising the ground voltage to a high voltage for turning off the light emitting diode and applying a start voltage to the gate terminal of the driving transistor; turning off the reset transistor at an data writing timing for turning off the light emitting diode, and applying an data voltage to the gate terminal of the driving transistor; and turning off the switching transistor after the data writing timing, lowering the ground voltage to a low voltage for driving the light emitting diode, and turning on the reset transistor.

As to the driving method described above, the step of turning on the switching transistor is by inputting a scan voltage via the scan line. The start voltage and the data voltage are applied to the gate terminal of the driving transistor via the signal line.

In the exemplary embodiment, the ground voltage is raised to the high voltage after a delay time, when the switching transistor is turned on by the scanning voltage via the scan line; and the delay time is determined by a time of tuning on the switching transistor.

In the exemplary embodiment, the gate terminal of the reset transistor is electrically connected to an autozero line.

As to the pixel structure described above, the switching transistor, the driving transistor and the reset transistor are thin film transistors.

As to the pixel structure described above, the switching transistor, the driving transistor and the reset transistor are made from poly-silicon or amorphous silicon.

As to the pixel structure described above, the first terminal of the light emitting diode is an anode, and the second terminal thereof is a cathode.

As to the pixel structure described above, the light emitting diode is made from an organic material.

As to the driving method described above, the start voltage Vo is applied to the gate terminal of the driving transistor so that a gate voltage thereof is Vo; and a source voltage is $Vo-V_T$, wherein the $V_T$ is a threshold voltage of the driving transistor.

As to the driving method described above, the data voltage Vdata is applied to the gate terminal of the driving transistor so that a voltage drop on the first capacitor is $Vdata-(Vo-V_T+\Delta Vdata)$, wherein the $\Delta Vdata=K(Vdata-Vo)$. The driving current of the light emitting diode is proportional to $(Vdata-Vo-\Delta Vdata)^2$.

As to the driving method described above, K=Cs/Ctotal, Cs represents a capacitance of the first capacitor, and Ctotal is a sum of capacitances on the source terminal of the driving transistor.

In the exemplary embodiment, the pixel structure further comprises a second capacitor disposed between the source terminal and the drain terminal of the reset transistor for adjusting the K. In another embodiment, the second capacitor is disposed between the first and the second terminals of the light emitting diode.

In order to make the aforementioned and other objects, features and advantages of the present invention understandable, a preferred embodiment accompanied with figures is described in detail below.

DETAILED DESCRIPTION

Following are the descriptions of the present to interpret the feature thereof. The scope of the present invention, however, is not limited thereto.

The present invention discloses a pixel structure of a display and a driving method thereof for compensating the threshold voltage of the thin film transistors.

Figure 1:
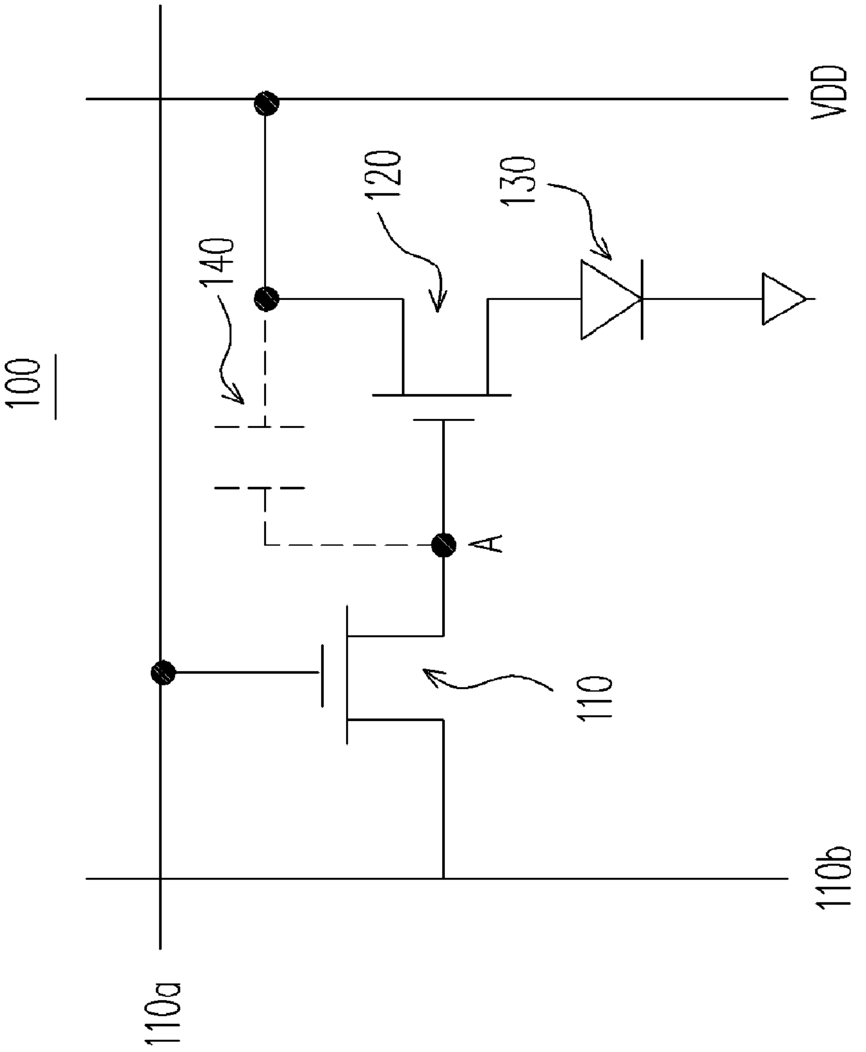
FIG. 1 (PRIOR ART)
FIG. 1 shows a conventional pixel structure of an organic LED display includes two N-type thin film transistors.
Figure 2B:
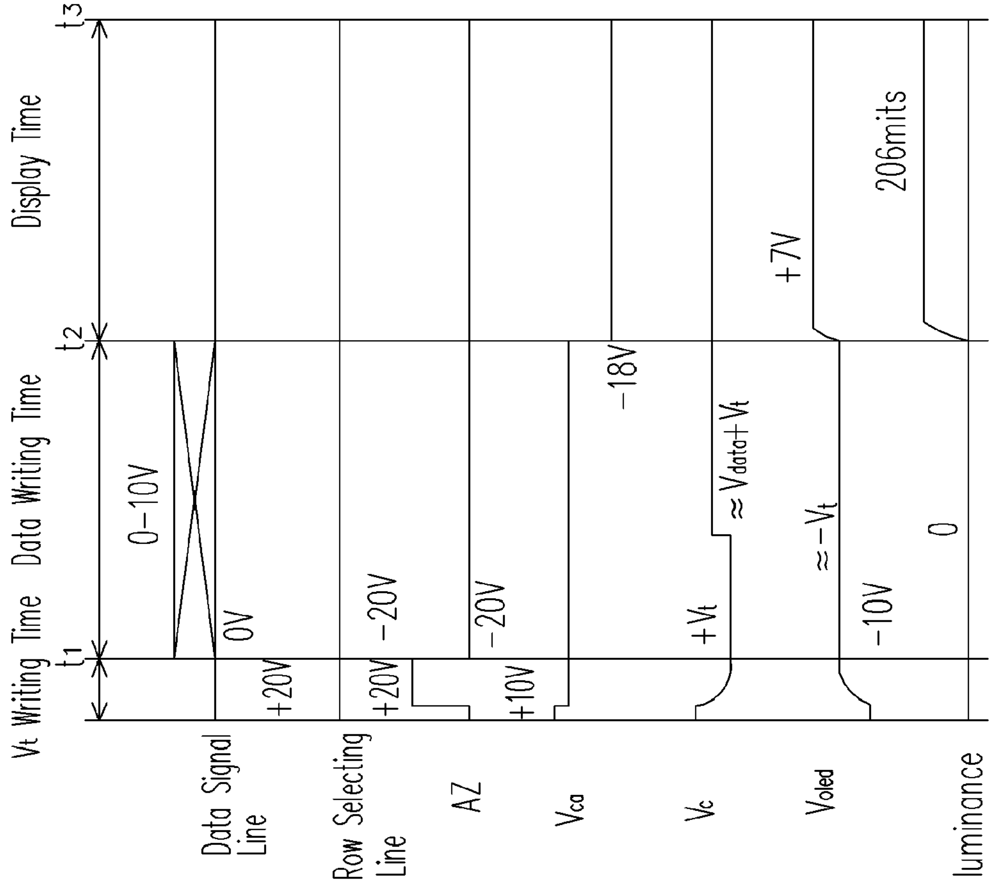
FIG. 2B shows a timing diagram of the pixel structure of the display shown in FIG. 2A.
Figure 2A:
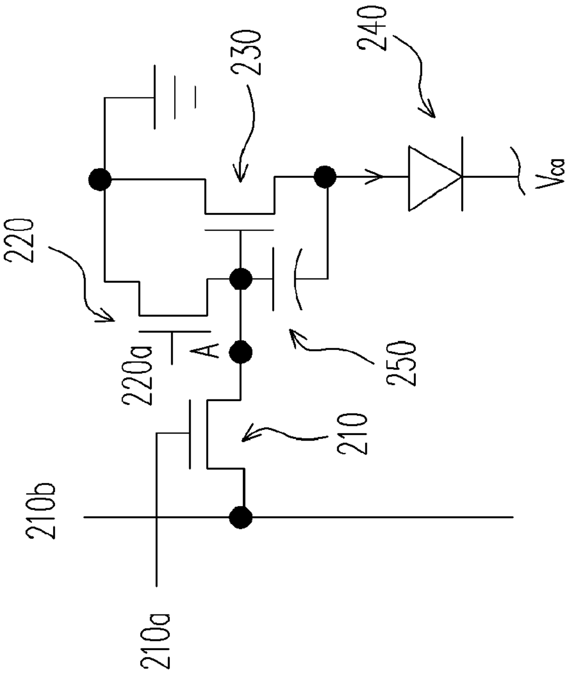
FIG. 2A shows another conventional pixel structure of an organic LED display.
Figure 2C:
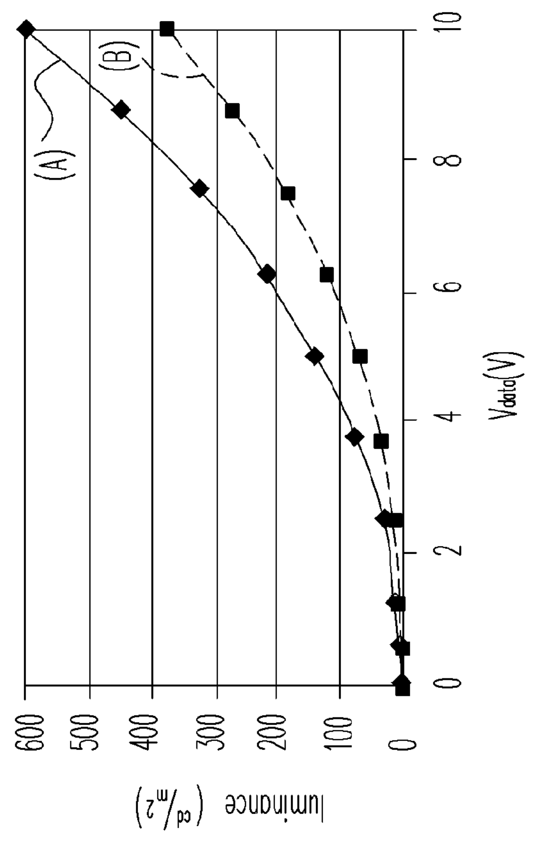
FIG. 2C(PRIOR ART)
FIG. 2C shows luminance with the data voltage Vdata for the modified voltage follower (solid) and a standard voltage follower (dashed) circuits.
Figure 2D:
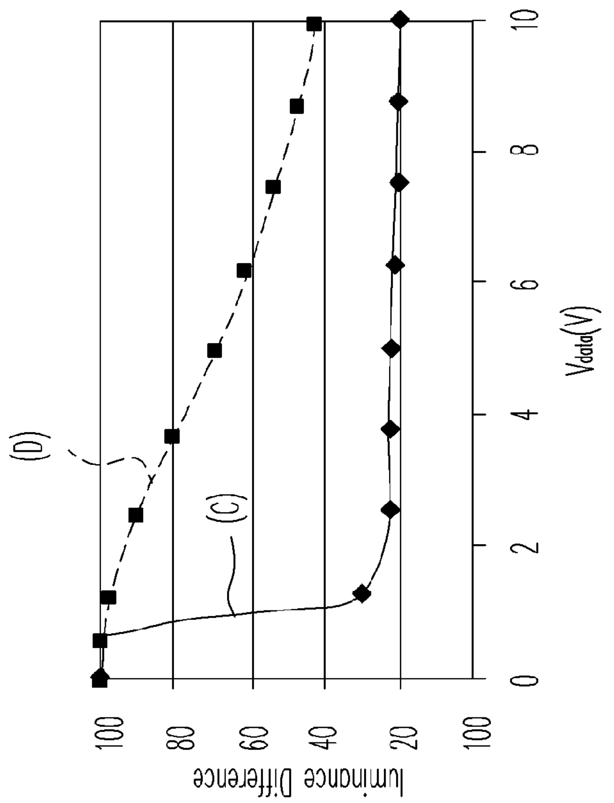
FIG. 2D(PRIOR ART)
FIG. 2D shows luminance difference with the data voltage Vdata for the modified voltage follower (solid) and a standard voltage follower (dashed) circuits, when the variations of the data voltage Vdata and the threshold voltage are under 2 V.
Figure 3B:
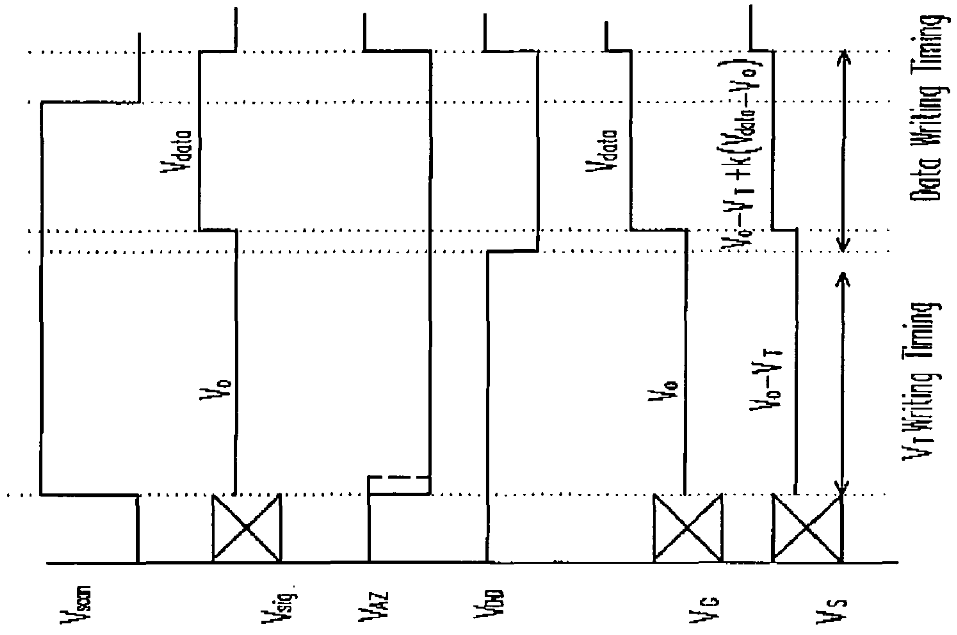
FIG. 3B shows a timing diagram related to a driving method of the pixel structure as shown in FIG. 3A.
Figure 3A:
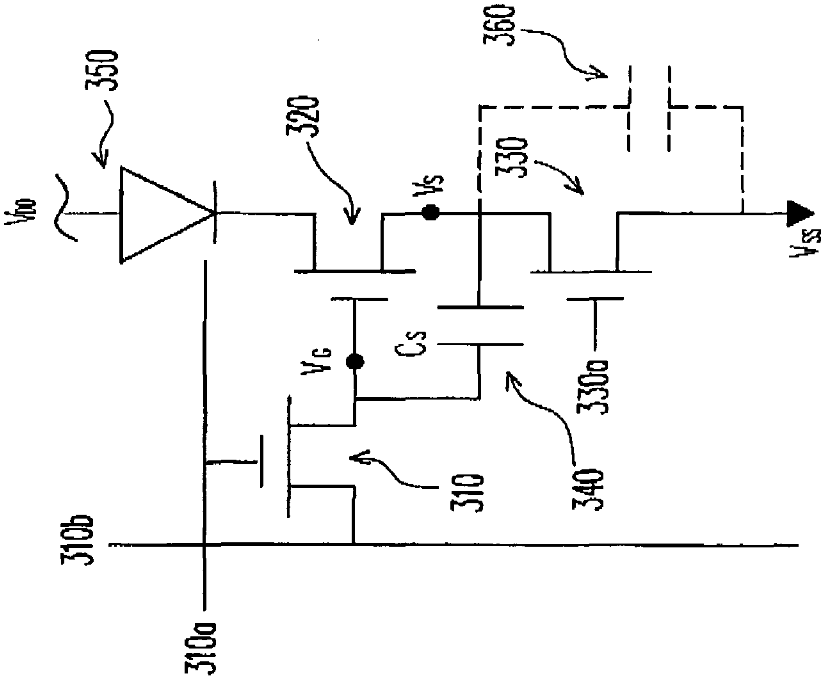
FIG. 3A shows a preferred embodiment of a pixel structure of a display.

FIG. 3A shows a preferred embodiment of a pixel structure of a display. FIG. 3B shows a timing diagram related to a driving method of a preferred embodiment of the present invention. The pixel structure shown in FIG. 3A includes three N-type transistors: a switch transistor 310, a driving transistor 320 and a reset transistor 330.

A gate terminal of the switching transistor 310 is electrically connected to a scan line 310*a,* and a source terminal thereof is electrically connected to a signal line 310*b,* i.e. a data signal line. A drain terminal thereof is electrically connected to the driving transistor 320 and electrically connected to the reset transistor 330 via a capacitor 340. A gate terminal of the reset transistor 330 is electrically connected to an autozero line AZ, a drain terminal thereof is electrically connected to the driving transistor 320, and a source terminal is electrically connected to a ground voltage $V_{SS}$. The anode of the light emitting diode 350 is electrically connected to an operational voltage $V_{DD}$, and the cathode thereof is electrically connected to the drain terminal of the driving transistor 320. The capacitor 340 is disposed between the gate and source terminals of the driving transistor 320 for storing the threshold voltage and the data voltage.

In a preferred embodiment, the pixel structure of the present invention includes thin film transistors and made from, such as poly-silicon or amorphous silicon. In the embodiment, the light emitting diode 350 can be an organic light emitting diode. However, the present invention is not limited thereto. Any other types of transistors or light emitting diodes can also be applied in the present invention. In addition to the N-type transistors, the present invention also can use P-type transistors by simply modifying the design of the driving part.

FIG. 3B is a timing diagram related to a driving method of the preferred embodiment of the pixel structure of the display shown in FIG. 3A. A threshold voltage ($V_T$) is applied to the capacitor 340 at a threshold voltage writing timing. The data signal is applied to the pixel at a data writing timing. The light emitting diode 350 then illuminates according to the data signal. At the beginning of the $V_T$ writing timing, the scanning signal voltage Vscan on the scan line 310*a* is raised to a high voltage for turning on the switching transistor 310. The $V_{AZ}$ on the AZ line is lowered to a low voltage for turning off the reset transistor 330. The rise of the $V_{AZ}$ and the lowering of the Vscan can occur simultaneously or the rise of the $V_{AZ}$ delays for a period of time as indicated by the dash line for synchronization with the switching transistor 310. The delay time depends on a time from the raising of the Vscan to the turning on of the switching transistor 310. Then, a start voltage Vo is applied to the signal line 310*b.* The current passes through the driving transistor 320 is zero. The voltage level $V_G$ of the gate terminal of the driving transistor 320 is charged to Vo, and the voltage level $V_S$ of the source terminal is charged to $Vo-V_T$.

At the data writing timing, the operational voltage $V_{DD}$ is in a low state for turning off the light emitting diode 350, that is, no current is passed through the terminals of the operational voltage $V_{DD}$ and the ground $V_{SS}$. The data voltage Vdata from the signal line 310*b* is electrically connected to the source terminal of the switching transistor 310. The voltage drop on the capacitor 340 is $Vdata-(Vo-V_T+\Delta Vdata)$, where $\Delta Vdata=K(Vdata-Vo)$ and $K=Cs/Ctotal$, Cs represents the capacitance of the capacitor 340, and Ctotal represents a sum of capacitances on the source terminal of the driving transistor 320. Moreover, in an alternative embodiment of the present invention, another capacitor 360 can be disposed between the source and drain terminals of the reset transistor 330 for changing the Ctotal and adjusting the K in response with the design requirement.

After the data writing time, the switching transistor 310 is turned off. The operational voltage $V_{DD}$ is raised to a high voltage for driving the light emitting diode 350, the $V_{AZ}$ also is in a high state for turning on the reset transistor 330. After the switching transistor 310 is turned off, the driving transistor 320 is floating. Therefore, the voltage drop on the capacitor 340 is still $Vdata-(Vo-V_T+\Delta Vdata)$. Because the driving transistor 320 is operated in a saturation region, the current is proportional to the $[Vdata-(Vo-V_T+\Delta Vdata)-V_T]^2$, or $(Vdata-Vo-\Delta Vdata)^2$. Accordingly, the current of the light emitting diode 350 is irrelevant to the $V_T$ of the driving transistor 320. Therefore, the operation of the pixel structure of the display does not depend on the $V_T$ and is affected thereby.

Figure 4B:
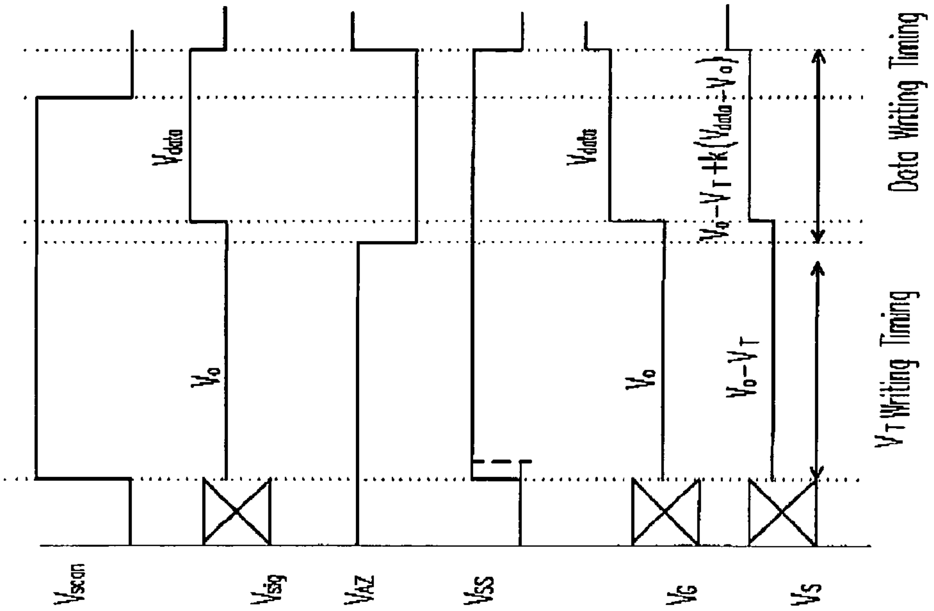
FIG. 4B shows another timing diagram related to a driving method of the pixel structure as shown in FIG. 4A.
Figure 4A:
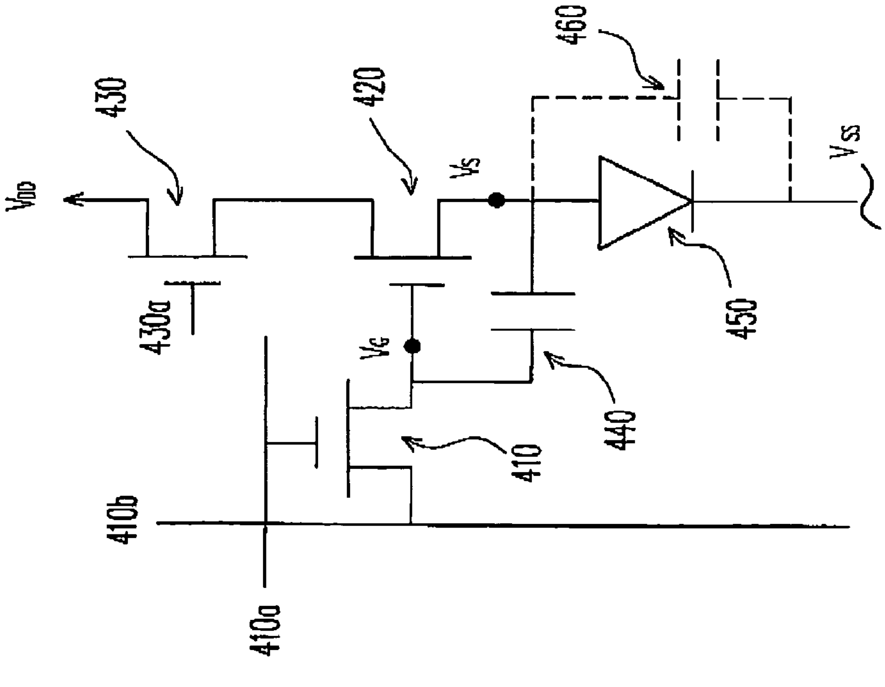
FIG. 4A shows another preferred embodiment of a pixel structure of a display.

FIG. 4A shows another preferred embodiment of a pixel structure of a display. FIG. 4B shows a timing diagram related to a driving method of another preferred embodiment of the present invention. The pixel structure shown in FIG. 4A includes three N-type transistors: a switch transistor 410, a driving transistor 420 and a reset transistor 430. A gate terminal of the switching transistor 410 is electrically connected to a scan line 410*a,* and a source terminal thereof is electrically connected to a signal line 410*b,* i.e. a data signal line. A drain terminal thereof is electrically connected to the driving transistor 420 and electrically connected to the anode of the light emitting diode 450 via the capacitor 440. A gate terminal of the reset transistor 430 is electrically connected to an autozero line AZ, a drain terminal thereof is electrically connected to the operational voltage $V_{DD}$, and a source terminal is electrically connected to the driving transistor 420. A cathode of the light emitting diode 450 is electrically connected to an ground voltage $V_{SS}$. The source terminal of the driving transistor 420 is electrically connected to the anode of the light emitting diode 450. The capacitor 440 is disposed between the gate and source terminals of the driving transistor 420 for storing the threshold voltage and the data voltage.

In a preferred embodiment, the pixel structure of the present invention is composed of thin film transistors and made from, such as poly-silicon or amorphous silicon. In the embodiment, the light emitting diode 450 can be an organic light emitting diode. However, the present invention is not limited thereto. Any other types of transistors or light emitting diodes can also be applied thereto. In addition to the N-type transistors, the present invention also can use P-type transistors, by simply modifying the design of the driving part.

FIG. 4B is a timing diagram related to a driving method of the preferred embodiment of the pixel structure of the display shown in FIG. 4A. A threshold voltage ($V_T$) is applied to the capacitor 440 at a threshold voltage writing timing. The data signal is applied to the pixel at a data writing timing. The light emitting diode 450 then illuminates according to the data signal.

At the beginning of the $V_T$ writing timing, the scanning signal voltage Vscan on the scan line 410*a* is raised from a low voltage level to a high voltage level for turning on t h e switching transistor 410. The $V_{SS}$ rises to a high voltage level. The rise of the $V_{SS}$ and the raise of the Vscan can occur simultaneously or the rise of the $V_{SS}$ delays for a period of time as indicated by the dash line for synchronization with the switching transistor 410. The delay time depends on a time from the raising of the Vscan to the turning on of the switching transistor 410. A start voltage Vo is then applied to the signal line 410*b*. The current passes through the driving transistor 420 is zero. In the driving transistor 420, the voltage level $V_G$ of the gate terminal is charged to Vo, and the voltage level $V_S$ of the source terminal is charged to $Vo-V_T$.

At the data writing timing, the $V_{AZ}$ on the AZ line is lowered to a low voltage for turning off the reset transistor 430 and avoiding any current flowing through the terminals of the $V_{DD}$ and the $V_{SS}$. A data voltage Vdata is applied to the signal line 410*b*, which is electrically connected to the source terminal of the switching transistor 410. The voltage drop on the capacitor 440 is $Vdata-(Vo-V_T+\Delta Vdata)$, wherein $\Delta Vdata=K(Vdata-Vo)$ and K=Cs/Ctotal, Cs represents the capacitance of the capacitor 440, and Ctotal represents a sum of capacitances on the source terminal of the driving transistor 420. Moreover, in an alternative embodiment, another capacitor 460 can be disposed between the anode and cathode of the light emitting diode 450 for changing the Ctotal and adjusting the K in response with the design requirement.

After the data writing time, the switching transistor 410 is turned off. The $V_{AZ}$ is raised to a high voltage for turning on the reset transistor 430, and the $V_{SS}$ is lowered to a low voltage for driving the light emitting diode 450. After the switching transistor 410 is turned off, the gate terminal of the driving transistor 420 is floating. Therefore, the voltage drop on the capacitor 440 is still $Vdata-(Vo-V_T+\Delta Vdata)$. Because the driving transistor 420 is in saturation region, the current is proportional to the $[Vdata-(Vo-V_T+\Delta Vdata)-V_T]^2$, or $(Vdata-Vo-\Delta Vdata)^2$. Accordingly, the current of the light emitting diode 450 is irrelevant to the $V_T$ of the driving transistor 420. Therefore, the operation of the pixel structure of the display does not depend on the $V_T$ and is affected thereby.

Accordingly, the present invention discloses a pixel structure of a display and a driving method thereof, which are easier that those of prior art and compensate the threshold voltage of the thin film transistors.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

The invention claimed is:

1. A pixel structure of a display, comprising:

a switching transistor, wherein a gate terminal of the switching transistor is electrically connected to a scan line, and a source terminal thereof is electrically connected to a signal line;

a driving transistor, wherein a gate terminal of the driving transistor is electrically connected to a drain terminal of the switching transistor;

a first capacitor disposed between the gate terminal of the driving transistor and a source terminal thereof;

a light emitting diode having a first terminal electrically connected to a operational voltage, and a second terminal electrically connected to a drain terminal of the driving transistor; and a reset transistor, wherein a gate terminal of the reset transistor is electrically connected to an autozero signal, a drain terminal is electrically connected to the driving transistor, and a source terminal electrically connected to a ground voltage.

2. The pixel structure of a display of claim 1, wherein the first terminal of the light emitting diode is an anode, and the second terminal thereof is a cathode.

3. The pixel structure of a display of claim 1, wherein the light emitting diode is made from an organic material.

4. The pixel structure of a display of claim 1, further comprising a second capacitor disposed between the source terminal and the drain terminal of the reset transistor.

5. The pixel structure of a display of claim 1, wherein the switching transistor, the driving transistor and the reset transistor are thin film transistors.

6. The pixel structure of a display of claim 5, wherein the switching transistor, the driving transistor and the reset transistor are made from poly-silicon.

7. The pixel structure of a display of claim 5, wherein the switching transistor, the driving transistor and the reset transistor are made from amorphous silicon.

8. A pixel structure of a display, comprising:

a switching transistor, wherein a gate terminal of the switching transistor is electrically connected to a scan line, and a source terminal thereof is electrically connected to a signal line;

a driving transistor, wherein a gate terminal of the driving transistor is electrically connected to a drain terminal of the switching transistor;

a first capacitor disposed between the gate terminal of the driving transistor and a source terminal thereof;

a light emitting diode having a second terminal electrically connected to a ground voltage, and a first terminal electrically connected to a source terminal of the driving transistor; and a reset transistor, wherein a gate terminal of the reset transistor is electrically connected to an autozero signal, a source terminal is electrically connected to the driving transistor, and a drain terminal electrically connected to an operational voltage.

9. The pixel structure of a display of claim 8, wherein the first terminal of the light emitting diode is an anode, and the second terminal thereof is a cathode.

10. The pixel structure of a display of claim 8, wherein the light emitting diode is made from an organic material.

11. The pixel structure of a display of claim 8, further comprising a second capacitor disposed between the first terminal and the second terminal of the light emitting diode.

12. The pixel structure of a display of claim 8, wherein the switching transistor, the driving transistor and the reset transistor are thin film transistors.

13. The pixel structure of a display of claim 12, wherein the switching transistor, the driving transistor and the reset transistor are made from poly-silicon.

14. The pixel structure of a display of claim 9, wherein the switching transistor, the driving transistor and the reset transistor are made from amorphous silicon.

15. A driving method of a pixel of a display, adapted for a pixel structure, wherein the pixel structure comprises:

a switching transistor, a driving transistor, a first capacitor, a light emitting diode and a reset transistor, a gate terminal of the driving transistor electrically connected to a drain terminal of the switching transistor, the first capacitor disposed between the gate terminal of the driving transistor and a source terminal thereof, the light emitting diode having a first terminal electrically connected to a operational voltage, and a second terminal electrically connected to a drain terminal of the driving transistor, a drain terminal of the reset transistor electrically connected to the driving transistor, and a source terminal thereof electrically connected to a ground voltage, the driving method comprising:

turning on the switching transistor at a threshold voltage writing timing, then turning off the reset transistor and applying a start voltage to the gate terminal of the driving transistor;

lowering the operational voltage to a low voltage at an data writing timing for turning off the light emitting diode, applying an data voltage to the gate terminal of the driving transistor; and turning off the switching transistor after the data writing timing, raising the operational voltage to a high voltage, turning on the reset transistor for driving the light emitting diode.

16. The driving method of a pixel of a display of claim 15, wherein the gate terminal of the reset transistor is electrically connected to an autozero line.

17. The driving method of a pixel of a display of claim 15, wherein the first terminal of the light emitting diode is an anode, and the second terminal thereof is a cathode.

18. The driving method of a pixel of a display of claim 15, wherein a gate terminal of the switching transistor is electrically connected to a scan line, a source terminal thereof is electrically connected to a signal line, a drain terminal thereof is electrically connected to the gate terminal of the driving transistor, and the step of turning on the switching transistor is by inputting a scan voltage via the scan line.

19. The driving method of a pixel of a display of claim 18, wherein the start voltage and the data voltage are applied to the gate terminal of the switching terminal via the signal line.

20. The driving method of a pixel of a display of claim 18, wherein the reset transistor is turned off after a delay time, when the switching transistor is turned on by the scanning voltage via the scan line; and the delay time is determined by a time of tuning on the switching transistor.

21. The driving method of a pixel of a display of claim 15, wherein the start voltage Vo is applied to the gate terminal of the driving transistor so that a gate voltage thereof is Vo; and a source voltage is $Vo-V_T$, wherein the $V_T$ is a threshold voltage of the driving transistor.

22. The driving method of a pixel of a display of claim 21, wherein the data voltage Vdata is applied to the gate terminal of the driving transistor so that a voltage drop on the first capacitor is $Vdata-(Vo-V_T+\Delta Vdata)$, wherein the $\Delta Vdata=K(Vdata-Vo)$.

23. The driving method of a pixel of a display of claim 22, wherein the a driving current of the light emitting diode is proportional to $(Vdata-Vo-\Delta Vdata)^2$.

24. The driving method of a pixel of a display of claim 22, wherein K=Cs/Ctotal, Cs represents a capacitance of the first capacitor, and Ctotal is a sum of capacitances on the source terminal of the driving transistor.

25. The driving method of a pixel of a display of claim 24, wherein the pixel structure further comprises a second capacitor disposed between the source terminal and the drain terminal of the reset transistor for adjusting the K.

26. A driving method of a pixel of a display, adapted for a pixel structure, wherein the pixel structure comprises:

a switching transistor, a driving transistor, a first capacitor, a light emitting diode and a reset transistor, a gate terminal of the driving transistor electrically connected to a drain terminal of the switching transistor, the first capacitor disposed between the gate terminal of the driving transistor and a source terminal thereof, the light emitting diode having a first terminal electrically connected to a source terminal of the driving transistor, and a second terminal electrically connected to a ground voltage, a source terminal of the reset transistor electrically connected to the driving transistor, and a drain terminal thereof electrically connected to an operational voltage, the driving method comprising:

turning on the switching transistor at a threshold voltage writing timing, then raising the ground voltage to a high voltage for turning off the light emitting diode and applying a start voltage to the gate terminal of the driving transistor;

turning off the reset transistor at an data writing timing, and applying an data voltage to the gate terminal of the driving transistor; and turning off the switching transistor after the data writing timing, lowering the ground voltage to a low voltage for driving the light emitting diode, and turning on the reset transistor.

27. The driving method of a pixel of a display of claim 26, wherein the gate terminal of the reset transistor is electrically connected to an autozero line.

28. The driving method of a pixel of a display of claim 26, wherein the first terminal of the light emitting diode is an anode, and the second terminal thereof is a cathode.

29. The driving method of a pixel of a display of claim 26, wherein a gate terminal of the switching transistor is electrically connected to a scan line, a source terminal thereof is electrically connected to a signal line, a drain terminal thereof is electrically connected to the gate terminal of the driving transistor, and the step of turning on the switching transistor is by inputting a scan voltage via the scan line.

30. The driving method of a pixel of a display of claim 29, wherein the start voltage and the data voltage are applied to the gate terminal of the driving transistor via the signal line.

31. The driving method of a pixel of a display of claim 29, wherein the ground voltage is raised to the high voltage after a delay time, when the switching transistor is turned on by the scanning voltage via the scan line;

and the delay time is determined by a time of tuning on the switching transistor.

32. The driving method of a pixel of a display of claim 26, wherein the start voltage Vo is applied to the gate terminal of the driving transistor so that a gate voltage thereof is Vo; and a source voltage is $Vo-V_T$, wherein the $V_T$ is a threshold voltage of the driving transistor.

33. The driving method of a pixel of a display of claim 31, wherein the data voltage Vdata is applied to the gate terminal of the driving transistor so that a voltage drop on the first capacitor is $Vdata-(Vo-V_T+\Delta Vdata)$, wherein the $\Delta Vdata=K(Vdata-Vo)$.

34. The driving method of a pixel of a display of claim 33, wherein the a driving current of the light emitting diode is proportional to $(Vdata-Vo-\Delta Vdata)^2$.

35. The driving method of a pixel of a display of claim 33, wherein K=Cs/Ctotal, Cs represents a capacitance of the first capacitor, and Ctotal is a sum of capacitances on the source terminal of the driving transistor.

36. The driving method of a pixel of a display of claim 35, wherein the pixel structure further comprises a second capacitor disposed between the first terminal and the second terminal of the light emitting diode for adjusting the K.

* * * * *